United States Patent
Kyoya

Patent Number: 6,012,854
Date of Patent: Jan. 11, 2000

[54] SEMICONDUCTOR LASER MODULE

[75] Inventor: Shouichi Kyoya, Miyagi-ken, Japan

[73] Assignee: Alps Electric Co., Ltd., Japan

[21] Appl. No.: 09/034,726

[22] Filed: Mar. 4, 1998

[30] Foreign Application Priority Data

Mar. 5, 1997 [JP] Japan ................................. 9-050386

[51] Int. Cl.⁷ .................................................. G02B 6/36
[52] U.S. Cl. ............................................. 385/88; 385/34
[58] Field of Search .................................. 385/88, 93, 33, 385/34

[56] References Cited

U.S. PATENT DOCUMENTS

| | | | |
|---|---|---|---|
| 4,790,618 | 12/1988 | Abe | 350/96.15 |
| 5,087,109 | 2/1992 | Ishizuka et al. | 385/34 |
| 5,353,294 | 10/1994 | Shigeno | 385/93 |
| 5,841,923 | 11/1998 | Kyoya | 385/93 |

*Primary Examiner*—Hung N. Ngo
*Attorney, Agent, or Firm*—Brinks Hofer Gilson & Lione

[57] ABSTRACT

The invention provides a semiconductor laser module that enhances the coupling efficiency of the semiconductor laser with an optical fiber, and reduces the dispersion of the coupling efficiency due to a fitting error of the semiconductor laser. The structure of the semiconductor laser module according to the invention is such that the outgoing point of beams from the semiconductor laser is dislocated by a distance $r_1$ from the optical axis of the optical fiber, so that the laser beams fallen on the end face of the core with a refractive index $n_1$ can penetrate in the direction parallel to the optical axis of the core. Here, the distance $r_1$ meets the following inequality:

$$0.6 f \sin \theta_2 < r_1 < f \sin \theta_2,$$

$\theta_2$ is an angle made by an optical axis of the outgoing beams from the coupling lens with a focal length f and an optical axis of the optical fiber, and $\theta_2$ meets, according to the Snell's law, $$\theta_2 = \sin^{-1}(n_1 \sin \phi) - \phi.$$

1 Claim, 2 Drawing Sheets

$$0.6 f \sin\theta_2 < r_1 < f \sin\theta_2$$

SEMICONDUCTOR LASER MODULE

BACKGROUND OF THE INVENTION

1. Field of the Invention

The present invention relates to a semiconductor laser module to guide laser beams emitted from a semiconductor laser to an end face of an optical fiber core, particularly to a coupling structure of a semiconductor laser and an optical fiber in the semiconductor laser module in which the end face of the optical fiber core is cut slant in order to prevent the laser beams from returning to the laser.

2. Description of the Related Art

Generally, this type of a semiconductor laser module is provided with a construction as shown in FIG. 1, in which a semiconductor laser 1 emits laser beams, and a coupling lens 2 converges the emitted laser beams so as to fall on an end face of a core 4 of an optical fiber 3. Further, the end face of the core 4 is cut slant so as to prevent the laser beams reflected on the end face from returning to the semiconductor laser 1.

This type of coupling structure is disclosed, for example, in the Japanese Patent Publication No. Hei 4-66324. According to this, the structure is designed such that the laser beams fallen on the end face 5 of the core 4 cut obliquely by an angle φ from a surface perpendicular to the optical axis of the optical fiber 3 penetrate in the direction parallel to the optical axis of the core 4. To achieve the foregoing, an angle $\theta_2$ made by an optical axis 6 of the outgoing beams from the coupling lens 2 and an optical axis 7 of the optical fiber 3 needs to satisfy the following equation, based on the Snell's law, $$\theta_2 = \sin^{-1}(n_1 \sin \phi) - \phi \tag{1}$$

here, $n_1$: refractive index of the core 4.

The coupling structure of the foregoing disclosure is made such that the outgoing point of beams from the semiconductor laser 1 is dislocated by a distance $r_1$ from the optical axis of the coupling lens 2. Here, if the focal length of the coupling lens 2 is f, according to the equation (1), the distance $r_1$ is given as follows.

$$r_1 = f \sin \theta_2 \tag{2}$$

However, generally deviating the position of the optical axis of a light source from the optical axis of a lens will increase an aberration virtually in proportion to the deviation $r_1$, as shown in FIG. 2. The foregoing conventional example only considers the Snell's law shown in the equation (1) and (2), and does not consider this aberration; and therefore, the example is worse in the coupling efficiency, which is a problem. Further, the coupling efficiency becomes asymmetric, depending on a fitting error deviated upward and/or downward from the position of the semiconductor laser 1 being dislocated by the distance $r_1$ from the optical axis. Therefore, the dispersion of the coupling efficiency becomes large, which is a problem.

SUMMARY OF THE INVENTION

The present invention has been made in view of the foregoing problems, and an object of the invention is to provide a semiconductor laser module in which the coupling efficiency of the semiconductor laser with the optical fiber can be enhanced and the dispersion of the coupling efficiency due to the fitting error of the semiconductor laser can be reduced.

In order to accomplish the foregoing object, considering that the deviation of the optical axis of a semiconductor laser from the optical axis of a lens increases an aberration in correspondence with the deviation to thereby deteriorate the coupling efficiency, the invention designs the semiconductor laser module wherein the semiconductor laser is located in a distance shorter than the deviation obtained by the Snell's law. Concretely, provided that an angle $\theta_2$ made by an optical axis of the outgoing beams from the coupling lens and an optical axis of the optical fiber is represented by $$\theta_2 = \sin^{-1}(n_1 \sin \phi) - \phi,$$

the outgoing point of beams from the semiconductor laser is dislocated by a distance $r_1$ from the optical axis of the optical fiber, wherein the distance $r_1$ meets the following inequality:

$$0.6 f \sin \theta_2 < r_1 < f \sin \theta_2.$$

The structure being thus designed, the coupling efficiency of the semiconductor laser with the optical fiber can be enhanced, and also the symmetry of the coupling efficiency can be bettered, even though there is an upward and/or downward fitting error of the semiconductor laser, which reduces the dispersion of the coupling efficiency due to a fitting error of the semiconductor laser.

DESCRIPTION OF THE PREFERRED EMBODIMENT

In the semiconductor laser module of the invention, when guiding the laser beams emitted from the semiconductor laser into an optical fiber in which the end face of the core with a refractive index $n_1$ is cut obliquely by an angle φ through a coupling lens with a focal length f, the outgoing point of beams from the semiconductor laser is dislocated by a distance $r_1$ from the optical axis of the optical fiber, wherein the distance $r_1$ meets the following inequality:

$$0.6 f \sin \theta_2 < r_1 < f \sin \theta_2,$$

so that the incident laser beams on the end face of the core can penetrate in the direction parallel to the optical axis of the core. Here, $\theta_2$ is an angle made by an optical axis of the outgoing beams from the coupling lens and an optical axis of the optical fiber, and $\theta_2$ meets the following equation according to the Snell's law:

$$\theta_2 = \sin^{-1}(n_1 \sin \phi) - \phi.$$

The embodiment of the invention will be described with reference to the accompanying drawings.

Figure 1:
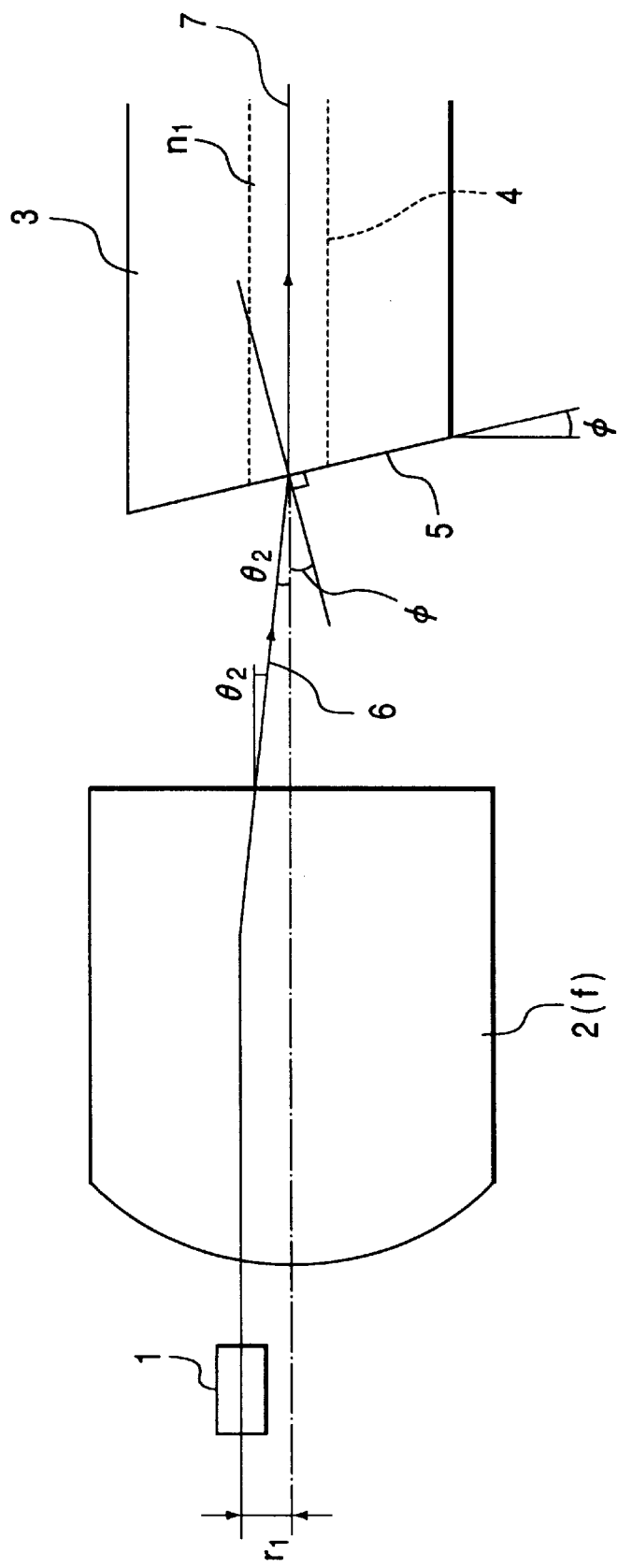
FIG. 1 illustrates a construction of a semiconductor laser module relating to one embodiment of the present invention.
Figure 2:
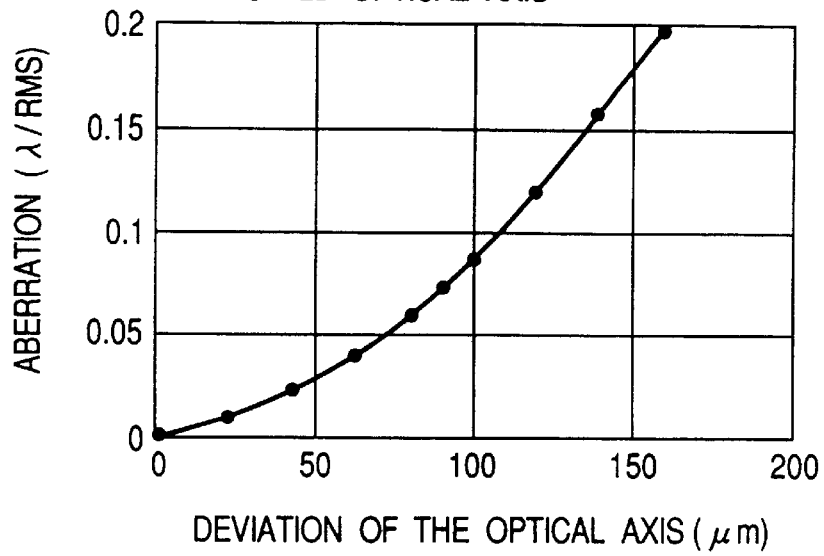
FIG. 2 is a chart to explain the relation between the deviation of the optical axis of the semiconductor laser in FIG. 1 and the aberration.
Figure 3:
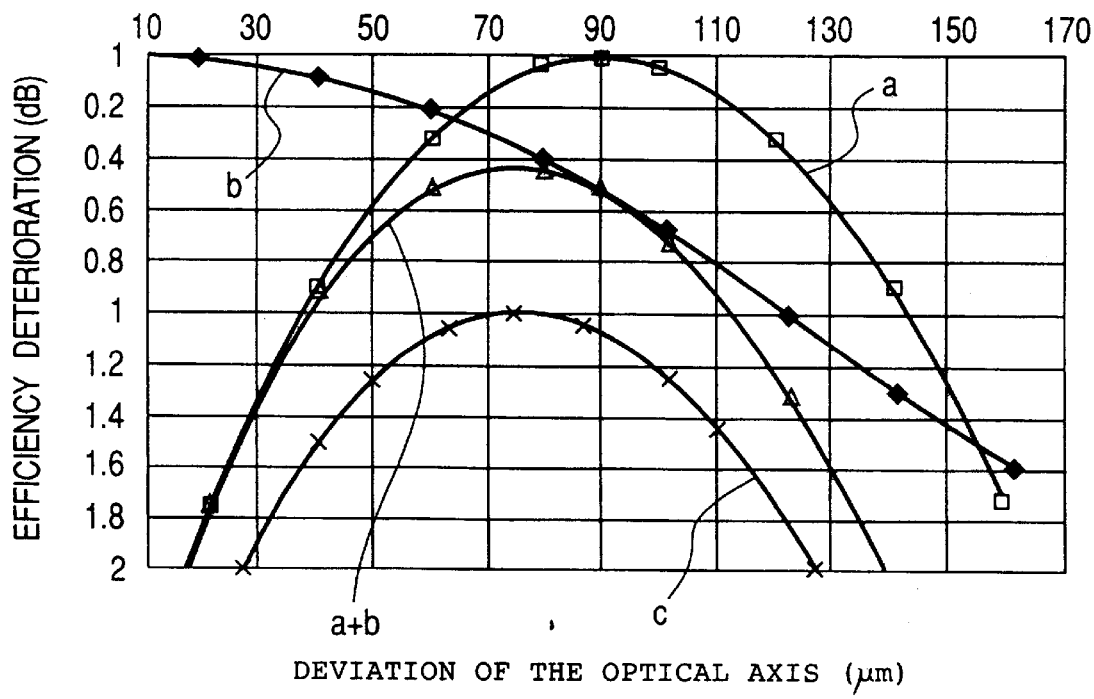
FIG. 3 is a chart to explain how the coupling efficiency deteriorates in the semiconductor laser module in FIG. 1, compared to the conventional example.

FIG. 1 illustrates a construction of a semiconductor laser module, FIG. 2 is a chart to explain the relation between the deviation of the optical axis of the semiconductor laser and the aberration, and FIG. 3 is a chart to explain the deterioration of the coupling efficiency in the semiconductor laser module and the conventional example.

As shown in FIG. 1, the end face 5 of the core 4 of the optical fiber 3 is cut slant by the angle φ from a surface perpendicular to the optical axis 7 of the optical fiber 3. And, the semiconductor laser 1 is located to deviate by the distance $r_1$ from the optical axis 7 of the optical fiber 3 (and the coupling lens 2). The laser (LD) beams emitted from the foregoing laser 1 are converged by the coupling lens 2 with the focal length f, and fall on the end face 5 of the core 4 of the optical fiber 3.

FIG. 2 illustrates the aberration (λ/RMS) in correspondence with the distance $r_1$ (μm), wherein the semiconductor laser 1 emits LD beams whose full width at half maximum of the divergent angle is 30×30, the wavelength λ=1310 (mm) to fall on the lens 2 whose magnification is 5, the numerical aperture (NA) of incidence is 0.55, and the focal length f is 1.37 mm. From FIG. 2, the aberration increases virtually proportionally as the distance $R_1$ increases. Here, in the foregoing equations (1) and (2), substituting φ=8, $n_1$=1.465 gives $r_1$=90 μm. Accordingly, the aberration in this case becomes about 0.07 (λ/RMS).

The curve a shown in FIG. 3 illustrates the efficiency deterioration against the distance $r_1$ in the conventional example. If this is correct, the efficiency deterioration becomes 0 (dB) at $r_1$=90 μm, and the efficiency deterioration becomes symmetric as the semiconductor laser 1 deviates upward and downward from this position. However, practically the aberration increases as the distance $r_1$ increases, as shown by the curve b. Therefore, if the efficiency deterioration by this aberration is added on the curve a, the optimum value of the distance $r_1$ becomes smaller than 90 μm; when $r_1$ is nearly equal to 72 μm, the efficiency becomes maximum. The curve c in FIG. 3 illustrates the measured value of the efficiency, and the curve a +b almost coincides with the measured value (curve c).

Therefore, as clearly indicated in FIG. 3, the structure wherein the laser beams fall with the maximum coupling efficiency on the end face 5 of the core 4 cut slant by the angle φ from a surface perpendicular to the optical axis of the optical fiber 3 is, provided that $$\theta_2 = \sin^{-1}(n_1 \sin \phi) - \phi \quad (1),$$

a structure wherein the outgoing point of beams from the semiconductor laser 1 is located at the distance $r_1$ from the optical axis of the optical fiber 3, wherein the distance $r_1$ meets the following.

$$0.6 f \sin \theta_2 < r_1 < f \sin \theta_2 \quad (3)$$

As shown in FIG. 3, according to the conventional example, when the position of the semiconductor laser 1 moves nearer than that of $r_1$=90 μm, the coupling efficiency becomes better due to the aberration; when the position moves farther than that of $r_1$=90 μm, the coupling efficiency becomes asymmetric and worse extremely. On the other hand, according to the embodiment, since the position of the semiconductor laser 1 deviates in the ± direction from the position at the distance $r_1$±72 μm, the coupling efficiency deteriorates symmetrically; and therefore, the dispersion due to a fitting error of the semiconductor laser 1 can be reduced to a minimum.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser module that guides laser beams emitted from a semiconductor laser into an optical fiber in which an end face of a core with a refractive index $n_1$ is cut obliquely by an angle φ through a coupling lens with a focal length f, the semiconductor laser module wherein an outgoing point of beams from the semiconductor laser is dislocated by a distance $r_1$ from an optical axis of the optical fiber so that the laser beams fallen on the end face of the core penetrates in the direction parallel to the optical axis of the core, wherein the distance $r_1$ meets the following inequality:

$$0.6 f \sin \theta_2 < r_1 < f \sin \theta_2,$$

$\theta_2$ is an angle made by an optical axis of the outgoing beams from the coupling lens and an optical axis of the optical fiber, and $\theta_2$ meets, according to the Snell's law, $$\theta_2 = \sin^{-1}(n_1 \sin \phi) - \phi.$$

* * * * *